(12) United States Patent
Karino et al.

(10) Patent No.: US 10,727,180 B2
(45) Date of Patent: Jul. 28, 2020

(54) RESISTIVE ELEMENT AND METHOD OF MANUFACTURING THE RESISTIVE ELEMENT

(71) Applicant: FUJI ELECTRIC CO., LTD., Kawasaki-shi (JP)

(72) Inventors: Taichi Karino, Matsumoto (JP); Hitoshi Sumida, Matsumoto (JP); Masaru Saito, Matsumoto (JP); Masaharu Yamaji, Matsumoto (JP); Osamu Sasaki, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/171,557

(22) Filed: Oct. 26, 2018

(65) Prior Publication Data
US 2019/0181089 A1 Jun. 13, 2019

(30) Foreign Application Priority Data
Dec. 13, 2017 (JP) ................................. 2017-238887

(51) Int. Cl.
*H01L 23/52* (2006.01)
*H01L 23/522* (2006.01)
(Continued)

(52) U.S. Cl.
CPC .......... *H01L 23/5228* (2013.01); *H01L 24/49* (2013.01); *H01L 28/24* (2013.01); *H01L 28/26* (2013.01); *H01L 24/03* (2013.01); *H01L 24/05* (2013.01); *H01L 24/29* (2013.01); *H01L 24/32* (2013.01); *H01L 24/83* (2013.01); *H01L 2224/02166* (2013.01); *H01L 2224/04026* (2013.01); *H01L 2224/04042* (2013.01); *H01L 2224/05082* (2013.01); *H01L 2224/05155* (2013.01); *H01L 2224/05166* (2013.01); *H01L 2224/05624* (2013.01); *H01L 2224/05644* (2013.01); *H01L 2224/29101* (2013.01);
(Continued)

(58) Field of Classification Search
CPC ... H01L 23/5228; H01L 23/52; H01L 23/522; H01L 24/49; H01L 28/24; H01L 28/26
USPC ........................................................ 257/536
See application file for complete search history.

(56) References Cited

U.S. PATENT DOCUMENTS

2003/0052329 A1\* 3/2003 Kobayashi .......... H01L 29/0619
  257/135
2019/0181216 A1\* 6/2019 Saito ..................... H01L 23/522

FOREIGN PATENT DOCUMENTS

JP 8-306861 A 11/1996

\* cited by examiner

*Primary Examiner* — Fazli Erdem

(57) ABSTRACT

A resistive element includes: a semiconductor substrate; a first insulating film deposited on the semiconductor substrate; a resistive layer deposited on the first insulating film; a second insulating film deposited to cover the first insulating film and the resistive layer; a first electrode deposited on the second insulating film and electrically connected to the resistive layer; a relay wire deposited on the second insulating film without being in contact with the first electrode, and including a resistive-layer connection terminal electrically connected to the resistive layer and a substrate connection terminal connected to the semiconductor substrate with an ohmic contact; and a second electrode deposited on a bottom side of the semiconductor substrate, wherein a resistor is provided between the first electrode and the second electrode.

17 Claims, 20 Drawing Sheets

(51) Int. Cl.
*H01L 23/00* (2006.01)
*H01L 49/02* (2006.01)
(52) U.S. Cl.
CPC ............... *H01L 2224/32245* (2013.01); *H01L 2224/83801* (2013.01); *H01L 2924/13055* (2013.01)

RESISTIVE ELEMENT AND METHOD OF MANUFACTURING THE RESISTIVE ELEMENT

CROSS-REFERENCE TO RELATED APPLICATION

This application claims benefit of priority under 35 USC 119 based on Japanese Patent Application No. 2017-238887 filed on Dec. 13, 2017, the entire contents of which are incorporated by reference herein.

BACKGROUND OF THE INVENTION

1. Field of the Invention

The present invention relates to a resistive element and a method of manufacturing the resistive element.

2. Description of the Related Art

JPH08-306861 discloses a resistive element for a semiconductor device, such as a semiconductor integrated circuit (IC), in which an insulating layer is deposited on a silicon substrate, and a thin-film resistive layer is deposited on the insulating layer. The resistive element disclosed in JPH08-306861 includes two electrodes connected to the resistive layer on both sides opposed to each other to which aluminum thin wires are bonded.

The resistive element disclosed in JPH08-306861 has a structure with the two electrodes opposed to each other connected on both sides of the top surface of the resistive layer. This structure leads to an increase in size of a chip and requires two bonding wires connected to the two electrodes.

SUMMARY OF THE INVENTION

In view of the foregoing problems, the present invention provides a resistive element with a size of a chip reduced and the number of bonding wires decreased, and provides a method of manufacturing the resistive element.

An aspect of the present invention inheres in a resistive element encompassing: a semiconductor substrate; a first insulating film deposited on the semiconductor substrate; a resistive layer deposited on the first insulating film; a second insulating film deposited to cover the first insulating film and the resistive layer; a first electrode deposited on the second insulating film and electrically connected to the resistive layer; a relay wire deposited on the second insulating film without being in contact with the first electrode, and including a resistive-layer connection terminal electrically connected to the resistive layer and a substrate connection terminal connected to the semiconductor substrate with an ohmic contact; and a second electrode deposited on a bottom side of the semiconductor substrate, wherein a resistor is provided between the first electrode and the second electrode.

Another aspect of the present invention inheres in a method of manufacturing a resistive element encompassing: forming a first insulating film on a semiconductor substrate; forming a resistive layer on the first insulating film; forming a second insulating film to cover the first insulating film and the resistive layer; cutting, in the second insulating film, a first contact hole to which the resistive layer is exposed, a second contact hole to which the resistive layer is exposed at a position separated from the first contact hole, and a third contact hole to which a part of a top surface of the semi-conductor substrate is exposed at a position separated from the first contact hole and the second contact hole; forming a first electrode electrically connected to the resistive layer via the first contact hole; forming a relay wire electrically connected to the resistive layer via the second contact hole and connected to the semiconductor substrate with an ohmic contact via the third contact hole; and forming a second electrode on a bottom side of the semiconductor substrate, wherein a resistor is provided between the first electrode and the second electrode.

DETAILED DESCRIPTION

Figure 1:
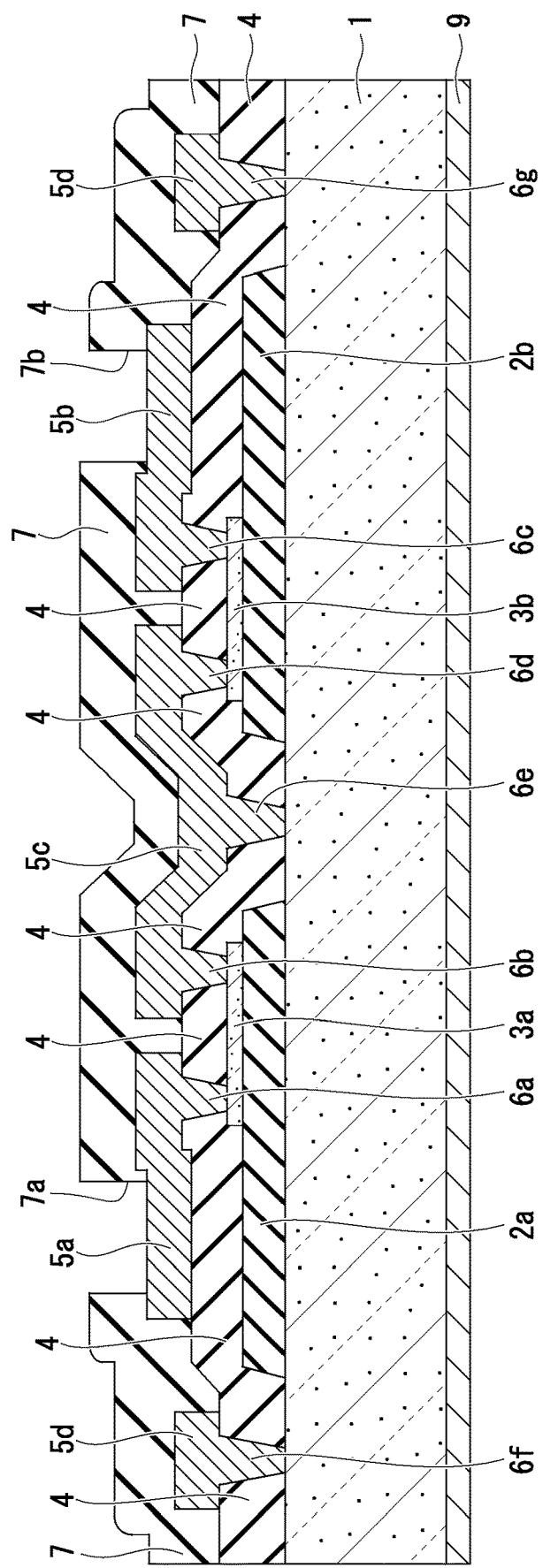
FIG. 1 is a cross-sectional view illustrating a resistive element according to an embodiment of the present invention.

With reference to the Drawings, an embodiment of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiment described below merely illustrate schematically devices and methods for specifying and giving shapes to the technical idea of the present invention, and the span of the technical idea is not limited to materials, shapes, structures, and relative positions of elements described herein. In addition, in the following description, the definition of the directions such as up and down is merely provided for the convenience of description and does not limit the technical idea of the invention. For example, when an object is rotated by 90 degrees and observed, the direction will be read by changing the up and down to the left and right; and when an object is rotated by 180 degrees and observed, the direction will be read by inverting the up and down.

A resistive element according to an embodiment of the present invention includes a semiconductor substrate 1 having a low specific resistivity, first insulating films 2a and 2b deposited on the semiconductor substrate 1, and thin-film resistive layers 3a and 3b deposited on the first insulating films 2a and 2b, as illustrated in FIG. 1. The resistive element is used as a gate resistor for an insulated-gate bipolar transistor (IGBT), for example.

A thickness of the semiconductor substrate 1 is about 350 micrometers, for example. The semiconductor substrate 1 may be a silicon substrate having a low specific resistivity and doped with a high concentration of n-type impurity ions. A resistive component of the semiconductor substrate 1 is preferably reduced to a level which can be ignored with respect to a resistive component of the resistive layers 3a and 3b. In particular, the resistive component of the semiconductor substrate 1 is preferably about one hundredth or less of the resistive component of the resistive layers 3a and 3b. The specific resistivity of the semiconductor substrate 1 may be in a range from 2 mΩ·cm to 60 mΩ·cm. Alternatively, the semiconductor substrate 1 may be a silicon substrate doped with a high concentration of p-type impurity ions, or may be made of elements other than silicon.

The first insulating films 2a and 2b may be a silicon oxide ($SiO_2$) film, a silicon nitride ($Si_3N_4$) film, or a composite film of these films. Alternatively, the first insulating films 2a and 2b may be made of an organic silicon compound deposited by a chemical vapor deposition (CVD) method using tetraethoxysilane (TEOS) gas to obtain a TEOS film. A thickness of the first insulating films 2a and 2b is about 800 nanometers, for example. An increase in thickness of the first insulating films 2a and 2b reduces a parasitic capacitance.

A thickness of the resistive layers 3a and 3b is about 500 nanometers, and a sheet resistance of the resistive layers 3a and 3b is about 150 Ω/sq, for example. A resistivity of the resistive layers 3a and 3b can be controlled by adjusting a width (in a depth direction in FIG. 1) and a length (in a right-left direction in FIG. 1) of the resistive layers 3a and 3b. The resistive layers 3a and 3b may be made of n-type doped polysilicon. The n-type doped polysilicon can be obtained such that n-type impurity ions such as phosphorus (P) are implanted in polycrystalline silicon (polysilicon), or polycrystalline silicon is added to a stacked layer with a CVD device.

Figure 2:
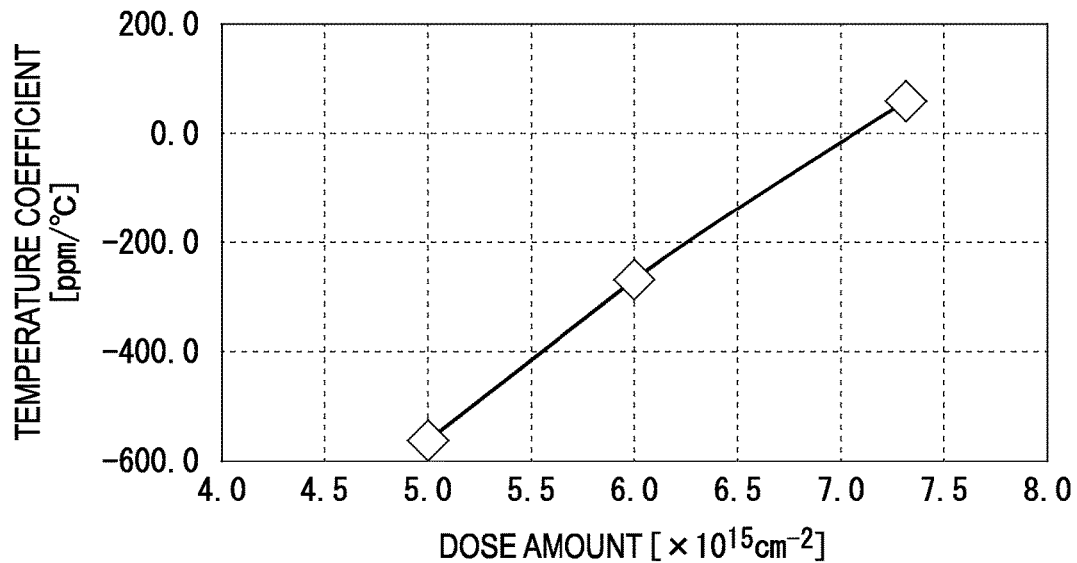
FIG. 2 is a graph showing a relation between a temperature coefficient and a dose amount in doped polysilicon.

A temperature coefficient of the resistive layers 3a and 3b is preferably zero ppm/° C. or lower. In other words, the resistive layers 3a and 3b preferably has a temperature coefficient of zero or a negative number. Such a temperature coefficient suppresses an increase in the resistivity during operation at a high temperature. For example, when the resistive element according to the embodiment of the present invention is used as a gate resistor for IGBT, a loss can be reduced when IGBT is turned on. The temperature coefficient of the doped polysilicon can be controlled by adjusting a dose amount of the impurity ions implanted in the polysilicon. FIG. 2 is a graph showing a relation between the temperature coefficient of the n-type doped polysilicon formed by ion implantation of phosphorus (P) and the dose amount of the impurity ions. For example, when the dose amount is set to about $7.0 \times 10^{15}$ $cm^{-2}$ or less, the temperature coefficient of the doped polysilicon can be reduced to zero ppm/° C. or lower. The temperature coefficient of the resistive layers 3a and 3b is not intended to be limited to zero ppm/° C. or lower. The resistive layers 3a and 3b may have a temperature coefficient of a positive number.

The resistive layers 3a and 3b may be made of p-type doped polysilicon. The p-type doped polysilicon can be obtained such that p-type impurity ions such as boron (B) are implanted in polysilicon. The resistive layers 3a and 3b are not limited to the doped polysilicon, and may be a nitride film of transition metal such as tantalum nitride ($TaN_x$), or a stacked metallic film having a high melting point including a chromium (Cr) film, a nickel (Ni) film, and a manganese (Mn) film stacked in this order. Alternatively, the resistive layers 3a and 3b may be a silver-palladium (AgPd) thin film or a ruthenium oxide ($RuO_2$) thin film. Instead of the structure illustrated in FIG. 1, the resistive layers 3a and 3b may be made of a p-type diffusion layer or an n-type diffusion layer deposited on the semiconductor surface.

A second insulating film (interlayer insulating film) 4 is provided to cover the first insulating films 2a and 2b and the resistive layers 3a and 3b. A thickness of the second insulating film 4 is about 1500 nanometers, for example. The second insulating film 4 may be a non-doped silicate glass (NSG) film, such as a silicon oxide film without containing phosphorus (P) or boron (B) (a $SiO_2$ film), a phosphosilicate glass (PSG) film, a borosilicate glass (BSG) film, a borophosphosilicate glass (BPSG) film, a silicon nitride ($Si_3N_4$) film, or a composite of some of these films. For example, the second insulating film 4 may be a composite film including a NSG film of about 770 nanometers and a PSG film of about 650 nanometers stacked on one another. The NSG film can suppress variation in resistance. The PSG film can increase strength of wire bonding.

A pair of first electrodes (front surface electrodes) 5a and 5b and a relay wire 5c are provided on the second insulating film 4. The first electrode 5a of the paired first electrodes 5a and 5b is allocated above the first insulating film 2a, and one end of the first electrode 5a horizontally overlaps with one end of the resistive layer 3a in the depth direction. The other first electrode 5b is allocated above the first insulating film 2b, and one end of the first electrode 5b horizontally overlaps with one end of the resistive layer 3b in the depth direction. The relay wire 5c is interposed between the pair of the first electrodes 5a and 5b and spans over the first insulating film 2a and the first insulating film 2b.

The first electrode 5a of the paired first electrodes 5a and 5b is connected to one end of the resistive layer 3a via a contact region 6a. The other end of the resistive layer 3a is connected to a resistive-layer connection terminal at one end (a first end) of the relay wire 5c via a contact region 6b. The other first electrode 5b is connected to one end of the resistive layer 3b via a contact region 6c. The other end of the resistive layer 3b is connected to a resistive-layer connection terminal at another end (a second end) of the relay wire 5c via a contact region 6d. A substrate connection terminal at still another end (a third end) of the relay wire 5c is connected to the semiconductor substrate 1 with an ohmic contact at low contact resistance via a contact region 6e. A second electrode 9 is deposited on the rear side of the semiconductor substrate 1. The resistive layers 3a and 3b are thus connected to the semiconductor substrate 1 in series via the relay wire 5c, so as to exhibit a vertical-type resistive element to provide a resistor between the first electrode 5a and the second electrode 9.

A thickness of the pair of the first electrodes 5a and 5b and the relay wire 5c is about three micrometers, for example. The pair of the first electrodes 5a and 5b and the relay wire 5c may be a stacked film including a titanium-titanium nitride (Ti—TiN) film of about 120 nanometers serving as barrier metal, an aluminum-silicon (Al—Si) film of about three micrometers, and a TiN—Ti film of about 45 nanometers serving as a reflection preventing film. Instead of Al—Si, Al or an Al alloy such as Al—Cu—Si and Al—Cu may be used. The pair of the first electrodes 5a and 5b each serve as an electrode pad. A bonding wire (not shown) having a diameter of about 300 micrometers made of metal such as Al is connected to the respective first electrodes 5a and 5b.

A guard ring layer 5d is deposited on the second insulating film 4. The guard ring layer 5d is delineated into a ring shape at an outer periphery of a chip of the resistive element according to the embodiment of the present invention. The guard ring layer 5d is connected to the semiconductor substrate 1 via contact regions 6f and 6g. The guard ring layer 5d is made of the same material as the pair of the first electrodes 5a and 5b and the relay wire 5c. The guard ring layer 5d prevents moisture from entering from the side surface of the chip.

A passivation film 7 is deposited on the pair of the first electrodes 5a and 5b, the relay wire 5c, and the guard ring layer 5d. The passivation film 7 may be a composite film including a TEOS film, a $Si_3N_4$ film, and a polyimide film sequentially stacked. The passivation film 7 is provided with openings 7a and 7b. The first electrodes 5a and 5b are exposed to the openings 7a and 7b to serve as pad regions connected with the bonding wire.

Figure 3:
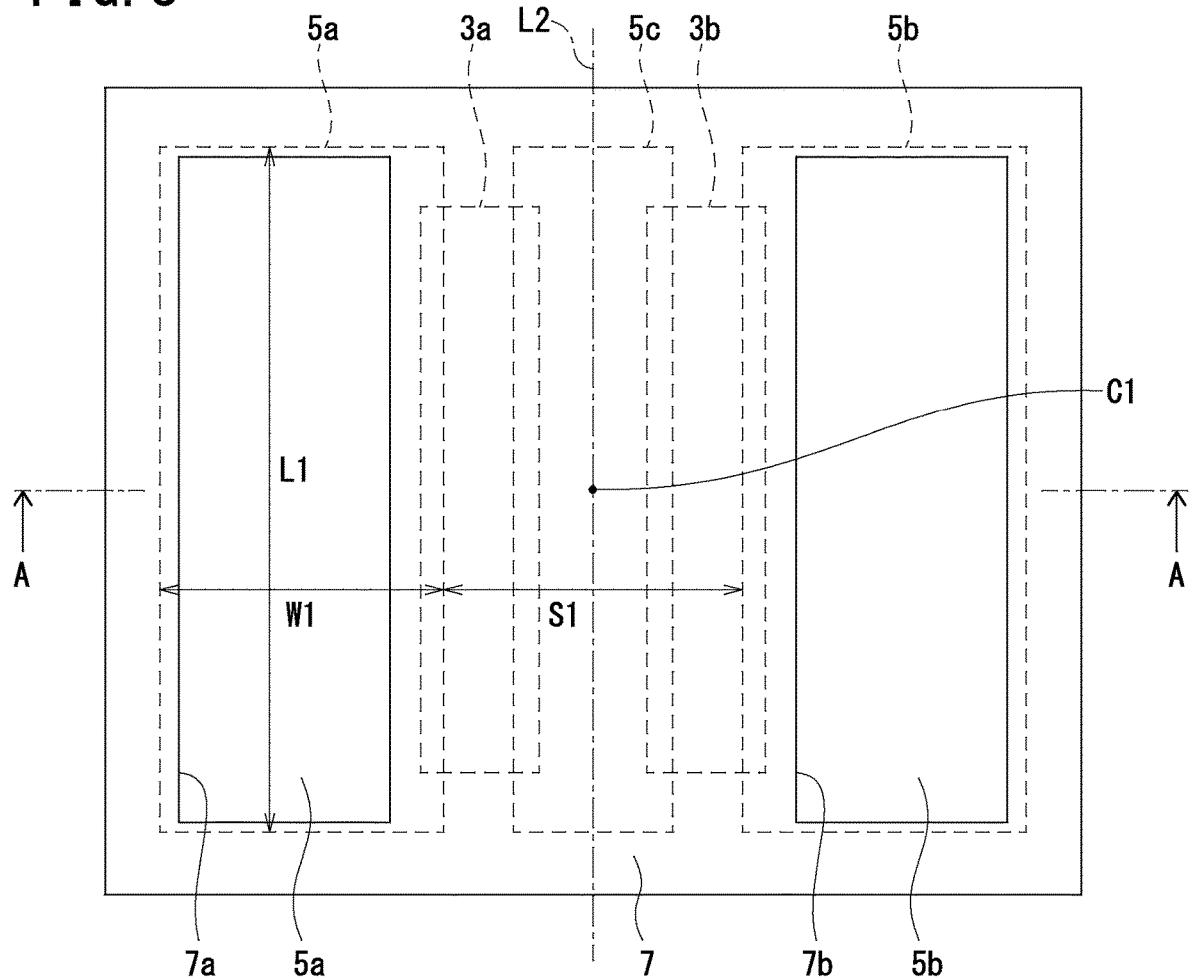
FIG. 3 is a plan view illustrating the resistive element according to the embodiment of the present invention.

FIG. 3 is a plan view of the resistive element according to the embodiment of the present invention. FIG. 1 is the cross-sectional view as viewed from direction A-A in FIG. 3. The resistive element according to the embodiment of the present invention has a rectangular planar pattern with a longitudinal direction in which the pair of the first electrodes 5a and 5b and the relay wire 5c are arranged. The chip of the resistive element according to the embodiment of the present invention has a size of about 2.8 millimeters×2.5 millimeters, for example. As illustrated in FIG. 3, the first electrode 5a of the paired first electrodes 5a and 5b allocated on the left side has a rectangular planar pattern having a length $L_1$ and a width $W_1$, which is the same as that of the other first electrode 5b allocated on the right side. The first electrode 5a and the other first electrode 5b are arranged in parallel and separated with a space $S_1$. The length $L_1$ is about 2.0 millimeters, a width $W_1$ is about 0.9 millimeters, and the space $S_1$ is about 0.5 millimeters or greater, for example. As illustrated in FIG. 3, the resistive layers 3a and 3b and the relay wire 5c also have a rectangular planar pattern with a longitudinal direction which is the vertical direction in FIG. 3.

The relay wire 5c having a rectangular planar pattern is allocated on the straight line L2 passing through the center C1 of the chip. The resistive layers 3a and 3b, the pair of the first electrodes 5a and 5b, and the relay wire 5c are arranged with line symmetry about the straight line L2 passing through the center C1 of the chip in the planar pattern. The planar pattern of the resistive layers 3a and 3b, the pair of the first electrodes 5a and 5b, and the relay wire 5c has two-fold rotational symmetry about the center C1 of the chip. The arrangement of the two-fold rotational symmetry enables the use of the resistive element turned by 180 degrees and thus facilitates an assembling process of the resistive element.

As illustrated in FIG. 1, the second electrode (rear surface electrode) 9 is deposited on the bottom surface of the semiconductor substrate 1. The second electrode 9 may be a single film made of gold (Au) or a metallic film including a Ti film, a Ni film and a Au film stacked in this order. The outermost layer of the second electrode 9 may be made of a material which can be soldered. The second electrode 9 is fixed to a metallic plate (not shown) by soldering.

Figure 4:
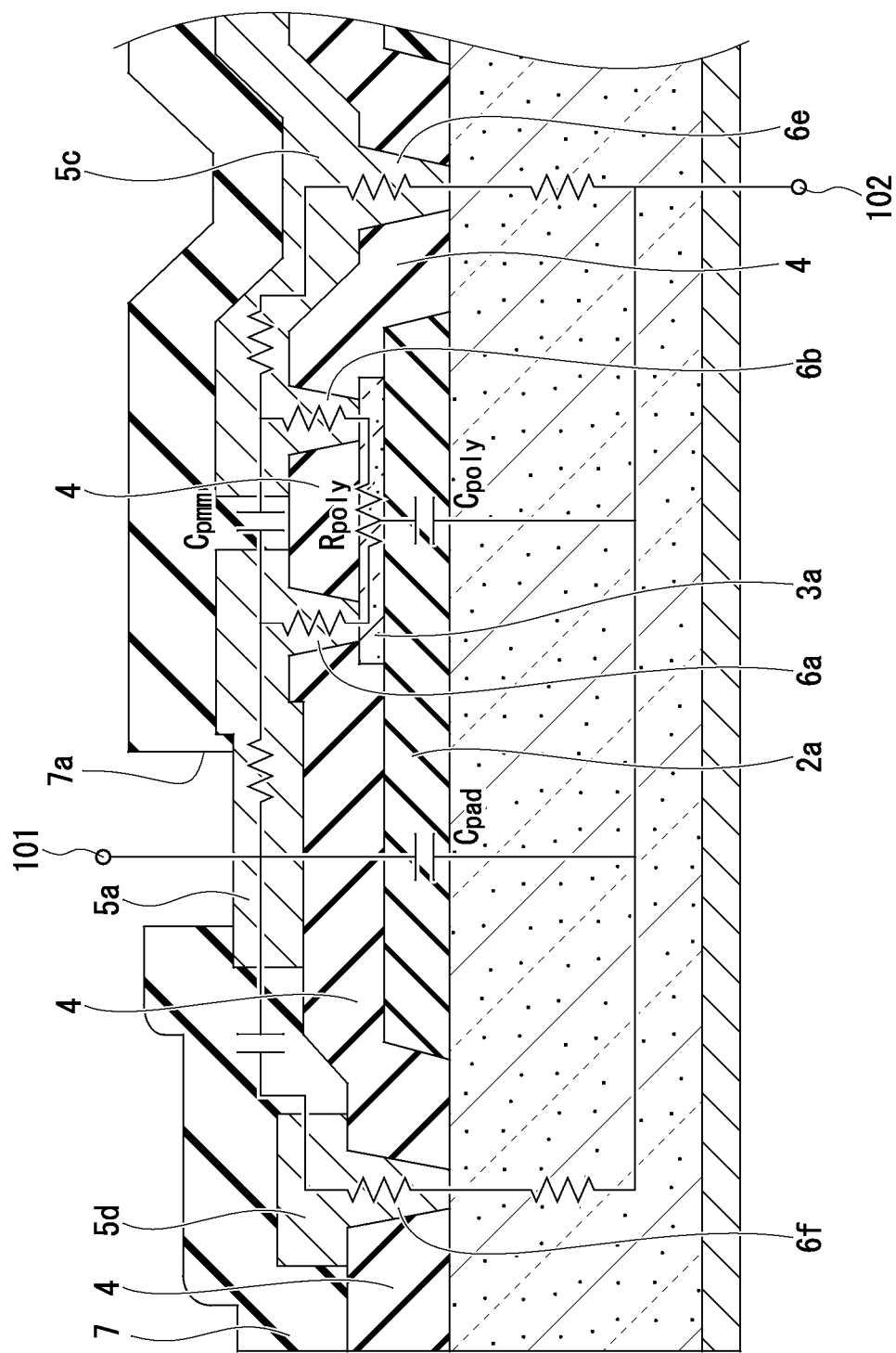
FIG. 4 is a cross-sectional view additionally illustrating an equivalent circuit superposed on the resistive element according to the embodiment of the present invention.

FIG. 4 is a cross-sectional view in which an equivalent circuit is superposed on the cross-sectional structure on the left side of the resistive element according to the embodiment of the present invention illustrated in FIG. 1. A terminal 101 is connected to the first electrode 5a of the paired first electrodes 5a and 5b, and a terminal 102 is connected to the second electrode 9. A parasitic capacitance $C_{pad}$ is provided below the first electrode 5a to use the first insulating film 2a and the second insulating film 4 as a dielectric material. A parasitic capacitance $C_{poly}$ is provided below the resistive layer 3a to use the first insulating film 2a as a dielectric material. A parasitic capacitance $C_{pad}$ allocated between one end of the first electrode 5a and one end (the resistive-layer connection terminal) of the relay wire 5c where the passivation film 7 is used as a dielectric material, is small and thus can be ignored.

Figure 5A:
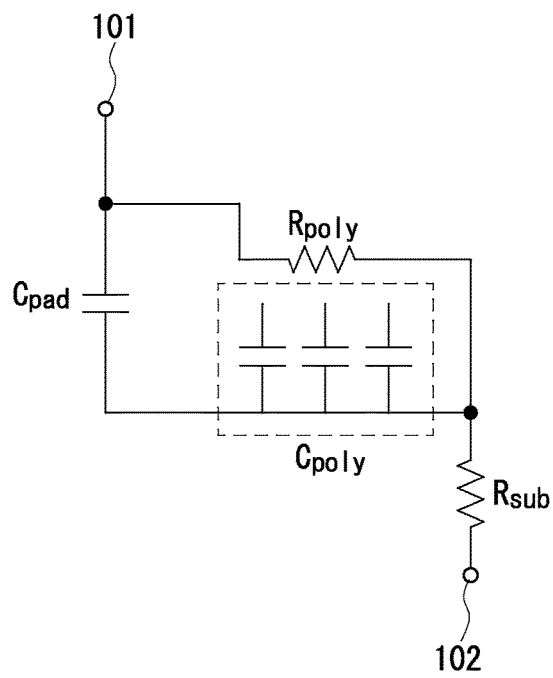
FIG. 5A and FIG. 5B are circuit diagrams illustrating equivalent circuits of the resistive element according to the embodiment of the present invention.
Figure 5B:
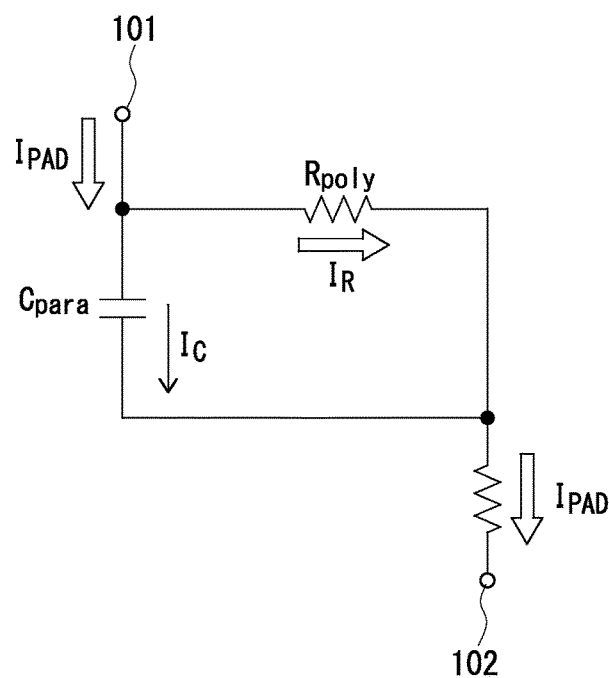

FIG. 5A is a circuit diagram of the equivalent circuit illustrated in FIG. 4. The parasitic capacitance $C_{poly}$ allocated below the resistive layer 3a and using the first insulating film 2a as a dielectric material is presumed to be connected in parallel to a resistor $R_{poly}$ of the resistive layer 3a. The parasitic capacitance $C_{pad}$ and the parasitic capacitance $C_{poly}$ are combined to provide a parasitic capacitance $C_{pad}$ as illustrated in FIG. 5B. If an impedance of the parasitic capacitance $C_{para}$ is lower than the chip resistor $R_{poly}$, a current $I_C$ flowing through the parasitic capacitance $C_{para}$ would be dominant, leading to oscillation. In order to prevent such oscillation, the parasitic capacitance $C_{para}$ should be calculated and confirmed with respect to a required cutoff frequency. The condition for preventing oscillation is that a current $I_{PAD}$ flowing through the chip is substantially equal to a current component $I_R$ flowing through the chip resistor $R_{poly}$. A low-pass filter is represented by the following equation (1):

$$f_c = 1/(2\pi C_{para} R_{poly}) \quad (1)$$

where $f_c$ is an oscillation frequency. The equation (1) can be changed to the following equation (2):

$$C_{para} = 1/(2\pi f_c R_{poly}) \quad (2)$$

The oscillation frequency $f_c$ is substituted into the equation (2) so as to calculate the parasitic capacitance $C_{para}$. Setting the parasitic capacitance $C_{para}$ to the calculated value or lower can ensure the current component $I_R$ flowing through the chip resistor $R_{poly}$ so as to prevent oscillation. The parasitic capacitance $C_{para}$ can be controlled by adjusting the thicknesses of the first insulating film 2a and the second insulating film 4.

Figure 7:
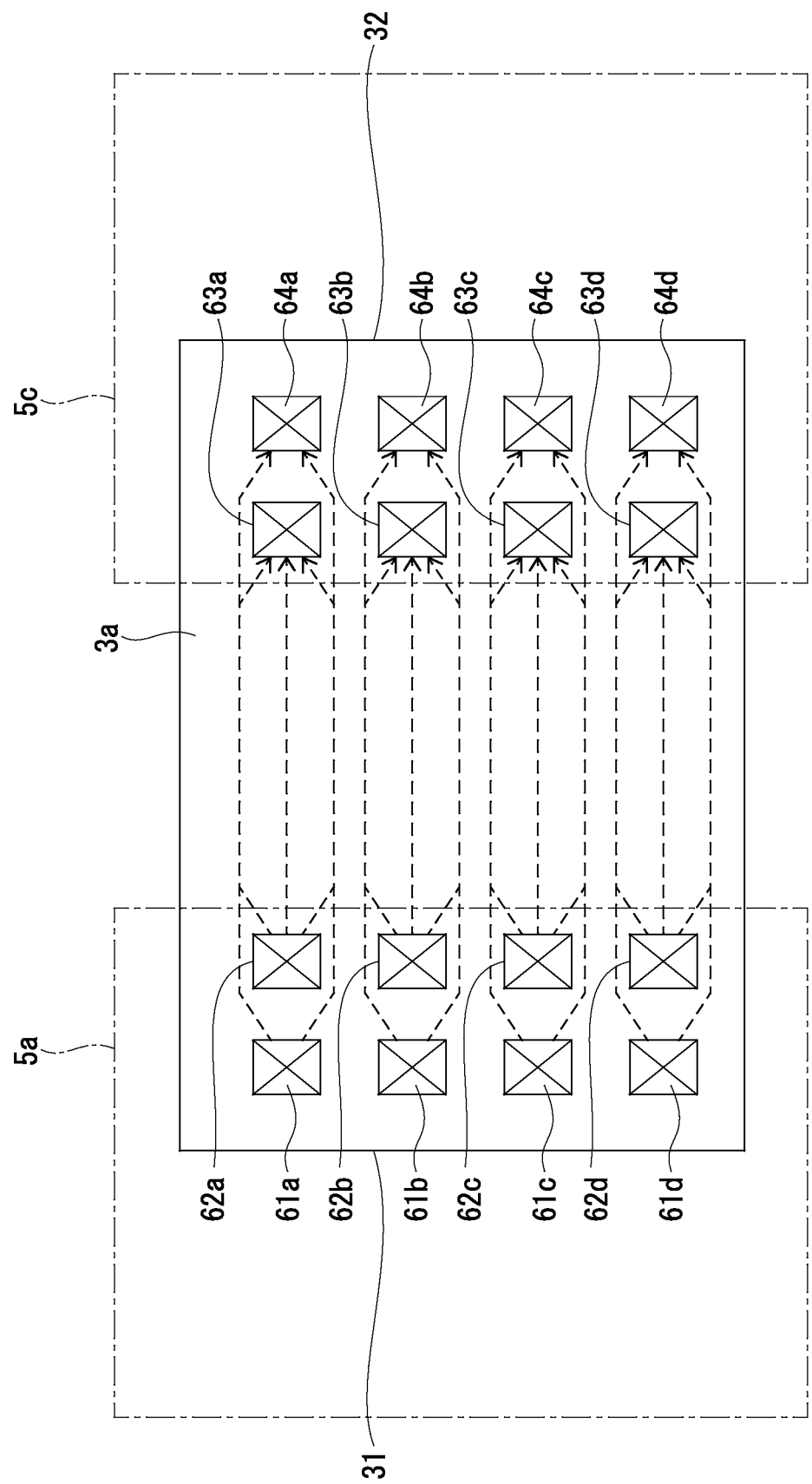
FIG. 7 is a plan view illustrating another contact arrangement in the resistive element according to the embodiment of the present invention.
Figure 8:
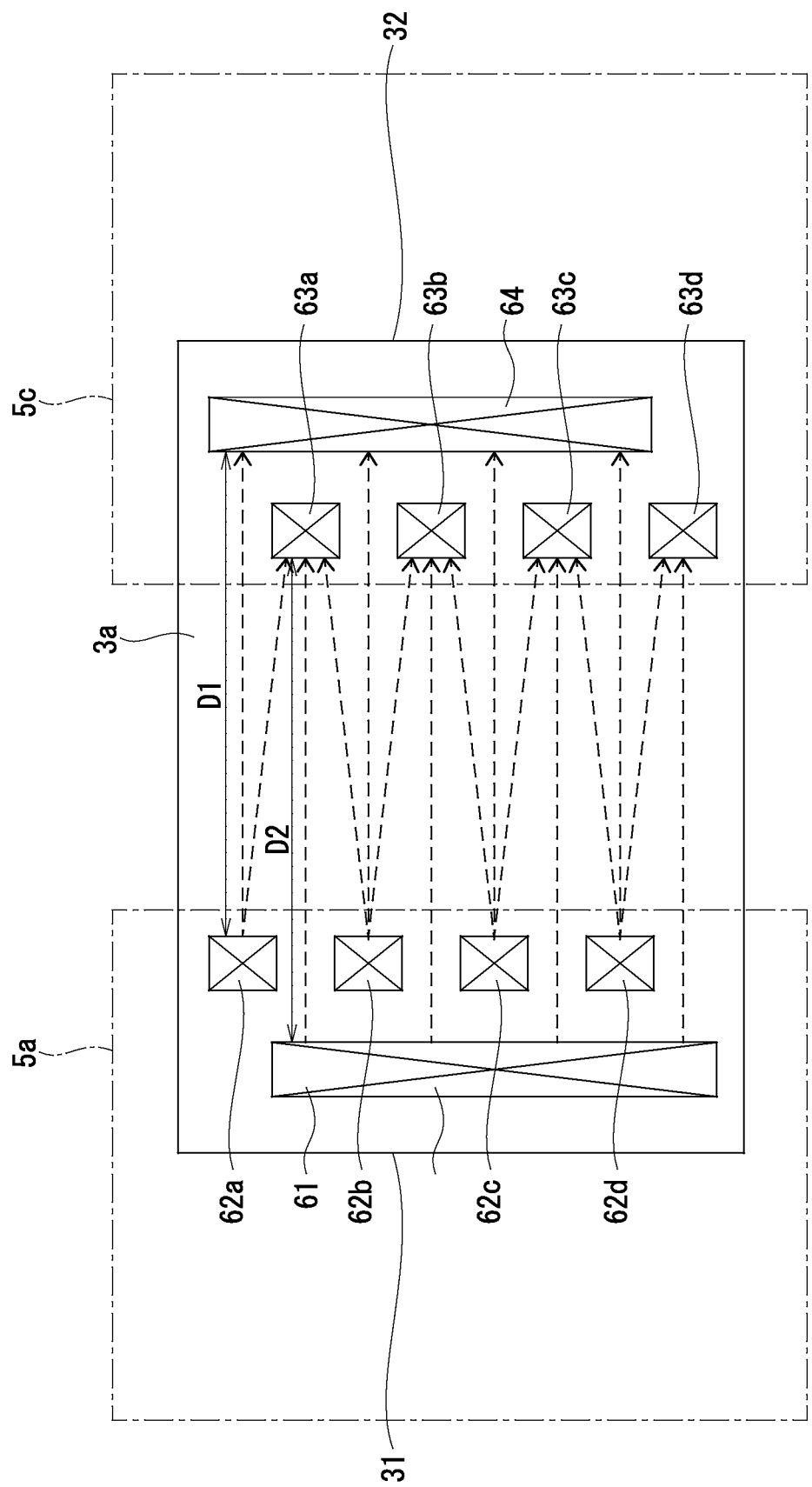
FIG. 8 is a plan view illustrating further contact arrangement in the resistive element according to the embodiment of the present invention.

A contact arrangement at the contact regions 6a and 6b connecting the resistive layer 3a to the first electrode 5a and the relay wire 5c illustrated in FIG. 1, is described below with reference to FIG. 6 to FIG. 8. While the following explanations with reference to FIG. 6 to FIG. 8 are focused on the resistive layer 3a, a similar contact arrangement can be used for the contact regions 6c and 6d connecting the resistive layer 3b to the other first electrode 5b and the relay wire 5c.

In the following explanations with reference to FIG. 6 to FIG. 8, a direction in which the length L1 of the first electrode 5a illustrated in the planar pattern of FIG. 3 is measured is defined as a resistance width direction, and a direction in which the width $W_1$ of the first electrode 5a is measured is defined as a resistance length direction. The resistance length direction is a main direction of the current components flowing through the resistive layer 3a, as indicated by the broken line arrows in FIG. 7. The space $S_1$ illustrated in FIG. 3 is also measured in the resistance length direction. The term "resistance length direction" as used herein refers to a main direction of flow of current in which the resistivity of the resistive layer 3a is determined on a macro level. Although the current components indicated by the broken line arrows in FIG. 6 vary in angle, the current components mainly flow in the resistance length direction when divided into vector components.

Figure 6:
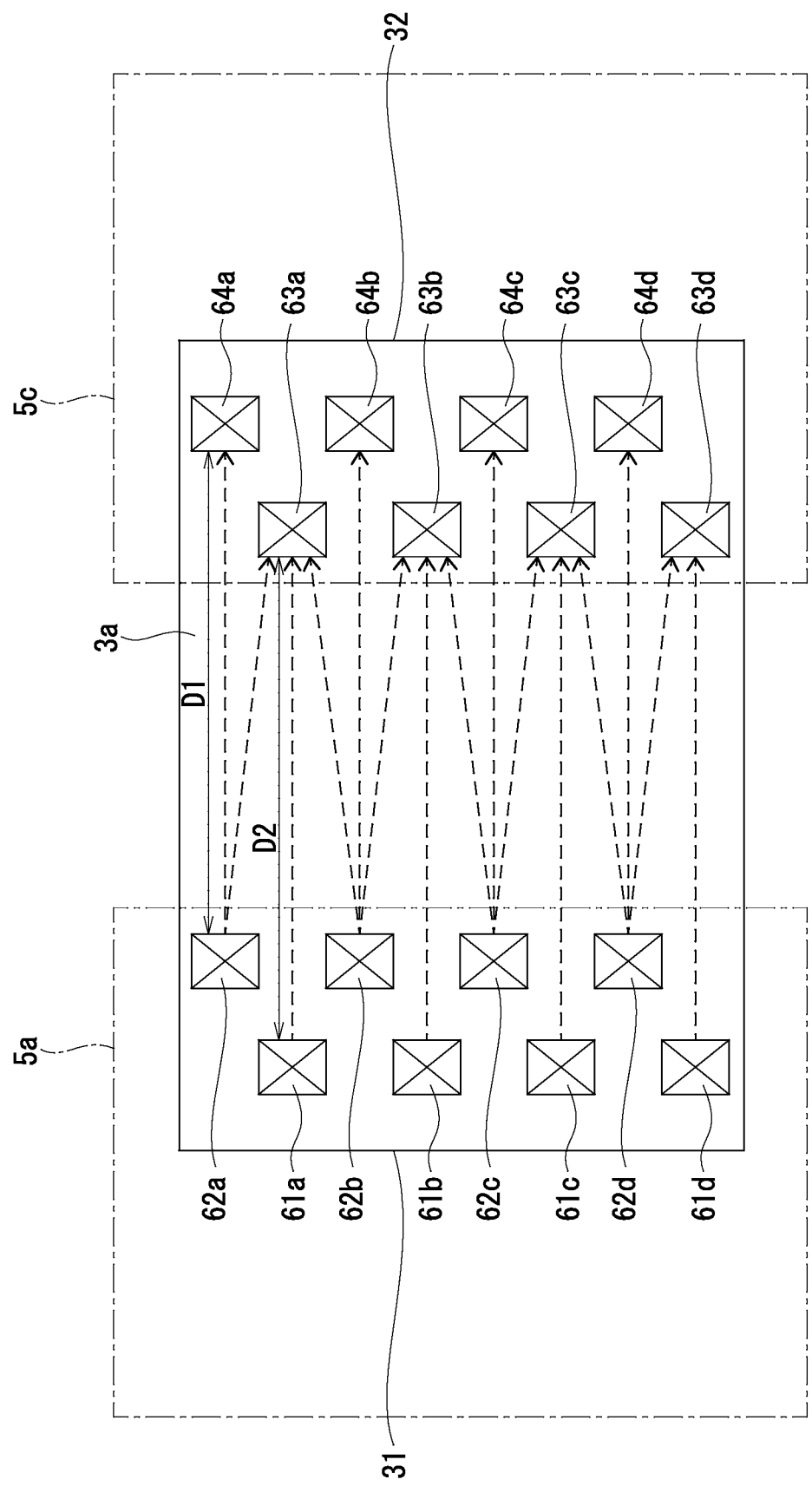
FIG. 6 is a plan view illustrating a contact arrangement in the resistive element according to the embodiment of the present invention.

As illustrated in FIG. 6, first outer contacts 61a to 61d and first inner contacts 62a to 62d closer to the middle (the inner side) of the resistive layer 3a than the first outer contacts 61a to 61d, are allocated toward one end (a first end) 31 of the resistive layer 3a. The first inner contacts 62a to 62d are aligned periodically in the resistance width direction. The first outer contacts 61a to 61d are arranged parallel to the first inner contacts 62a to 62d and aligned periodically in the resistance width direction. The first inner contacts 62a to 62d and the first outer contacts 61a to 61d are shifted from each other in a zigzag (checkered) pattern in the resistance width direction so as not to overlap each other.

Second outer contacts 64a to 64d and second inner contacts 63a to 63d closer to the middle (the inner side) of the resistive layer 3a than the outer contacts 64a to 64d, are allocated toward the other end (a second end) 32 of the resistive layer 3a opposite to the first end 31 in the resistance length direction. The second inner contacts 63a to 63d are aligned periodically in the resistance width direction. The second outer contacts 64a to 64d are arranged parallel to the second inner contacts 63a to 63d and aligned periodically in the resistance width direction. The second inner contacts 63a to 63d and the second outer contacts 64a to 64d are shifted from each other in a zigzag (checkered) pattern in the resistance width direction so as not to overlap each other.

The first inner contacts 62a to 62d and the second inner contacts 63a to 63d are shifted from each other in the resistance width direction so as not to overlap each other. The first inner contacts 62a to 62d are opposed to the second outer contacts 64a to 64d through the respective gaps between the second inner contacts 63a to 63d, as viewed in the resistance length direction. The second inner contacts 63a to 63d are opposed to the first outer contacts 61a to 61d through the respective gaps between the first inner contacts 62a to 62d, as viewed in the resistance length direction.

While FIG. 6 illustrates that the width of the respective gaps between the second inner contacts 63a to 63d is identical to the length of the second outer contacts 64a to 64d in the resistance width direction, the width and the length may be different from each other. For example, the respective gaps between the second inner contacts 63a to 63d illustrated in FIG. 6 may be decreased so that the first inner contacts 62a to 62d are partly opposed to the second outer contacts 64a to 64d. Alternatively, the respective gaps between the second inner contacts 63a to 63d illustrated in FIG. 6 may be increased so as to provide spaces where the second inner contacts 63a to 63d and the second outer contacts 64a to 64d are not present as viewed in the resistance length direction.

Similarly, the width of the respective gaps between the first inner contacts 62a to 62d is identical to the length of the first outer contacts 61a to 61d in the resistance width direction, but the width and the length may be different from each other. For example, the respective gaps between the first inner contacts 62a to 62d illustrated in FIG. 6 may be decreased so that the second inner contacts 63a to 63d are partly opposed to the first outer contacts 61a to 61d. Alternatively, the respective gaps between the first inner contacts 62a to 62d illustrated in FIG. 6 may be increased so as to provide spaces where the first inner contacts 62a to 62d and the first outer contacts 61a to 61d are not present as viewed in the resistance length direction.

A distance D1 between the first inner contacts 62a to 62d and the second outer contacts 64a to 64d is preferably, but not necessarily, identical to a distance D2 between the second inner contacts 63a to 63d and the first outer contacts 61a to 61d. For example, the distance D1 may be greater than the distance D2, or the distance D1 may be smaller than the distance D2. The distance D1 between the respective pairs of the first inner contacts 62a to 62d and the second outer contacts 64a to 64d opposed to each other may be either the same or different from each other. The distance D2 between the respective pairs of the second inner contacts 63a to 63d and the first outer contacts 61a to 61d opposed to each other may be either the same or different from each other.

As in a contact arrangement illustrated in FIG. 7, the positions of the first inner contacts 62a to 62d and the first outer contacts 61a to 61d in the resistance width direction on the first end 31 side may be provided to overlap each other as viewed in the resistance length direction. Similarly, the positions of the second inner contacts 63a to 63d and the second outer contacts 64a to 64d in the resistance width direction on the second end 32 side may be provided to overlap each other as viewed in the resistance length direction. The positions of the first inner contacts 62a to 62d and the second inner contacts 63a to 63d in the resistance width direction also overlap each other as viewed in the resistance length direction.

In the contact arrangement illustrated in FIG. 7, the first inner contacts 62a to 62d aligned in the resistance width direction and the second inner contacts 63a to 63d aligned in the resistance width direction are opposed to each other as viewed in the resistance length direction. The second outer contacts 64a to 64d aligned in the resistance width direction are thus hidden behind the second inner contacts 63a to 63d as viewed in the resistance length direction. The first outer contacts 61a to 61d aligned in the resistance width direction are also hidden behind the first inner contacts 62a to 62d as viewed in the resistance length direction. As indicated by the broken line arrows in FIG. 7, current components flowing through the resistive layer 3a are uneven, and current tends to be concentrated around the first inner contacts 62a to 62d and the second inner contacts 63a to 63d opposed to each other with the shortest distance in the resistance length direction.

In contrast, the contact arrangement illustrated in FIG. 6 having larger effective contact areas allows the current components to be uniform in the contacts, as indicated by the broken line arrows in FIG. 6, so as to prevent current concentration from varying depending on the contacts. The prevention of current concentration enhances the resistance to surge current with less variation in the resistivity.

Alternatively, as illustrated in FIG. 8, the resistive element may have a contact arrangement with a first outer contact 61 and a second outer contact 64 each having a linear (line) pattern extending in the resistance width direction. The arrangements of the first inner contacts 62a to 62d and the second inner contacts 63a to 63d are the same as in the contact arrangement illustrated in FIG. 6. The first inner contacts 62a to 62d aligned in the resistance width direction are partly opposed to the second outer contact 64 through the respective gaps between the second inner contacts 63a to 63d, as viewed in the resistance length direction. The second inner contacts 63a to 63d aligned in the resistance width direction are partly opposed to the first outer contact 61 through the respective gaps between the first inner contacts 62a to 62d, as viewed in the resistance length direction.

The contact arrangement illustrated in FIG. 8 having larger effective contact areas allows the current components to be uniform in the contacts, so as to prevent current concentration from varying depending on the contacts, as in the case of the contact arrangement illustrated in FIG. 6. The prevention of current concentration enhances the resistance to surge current with less variation in the resistivity.

Figure 9:
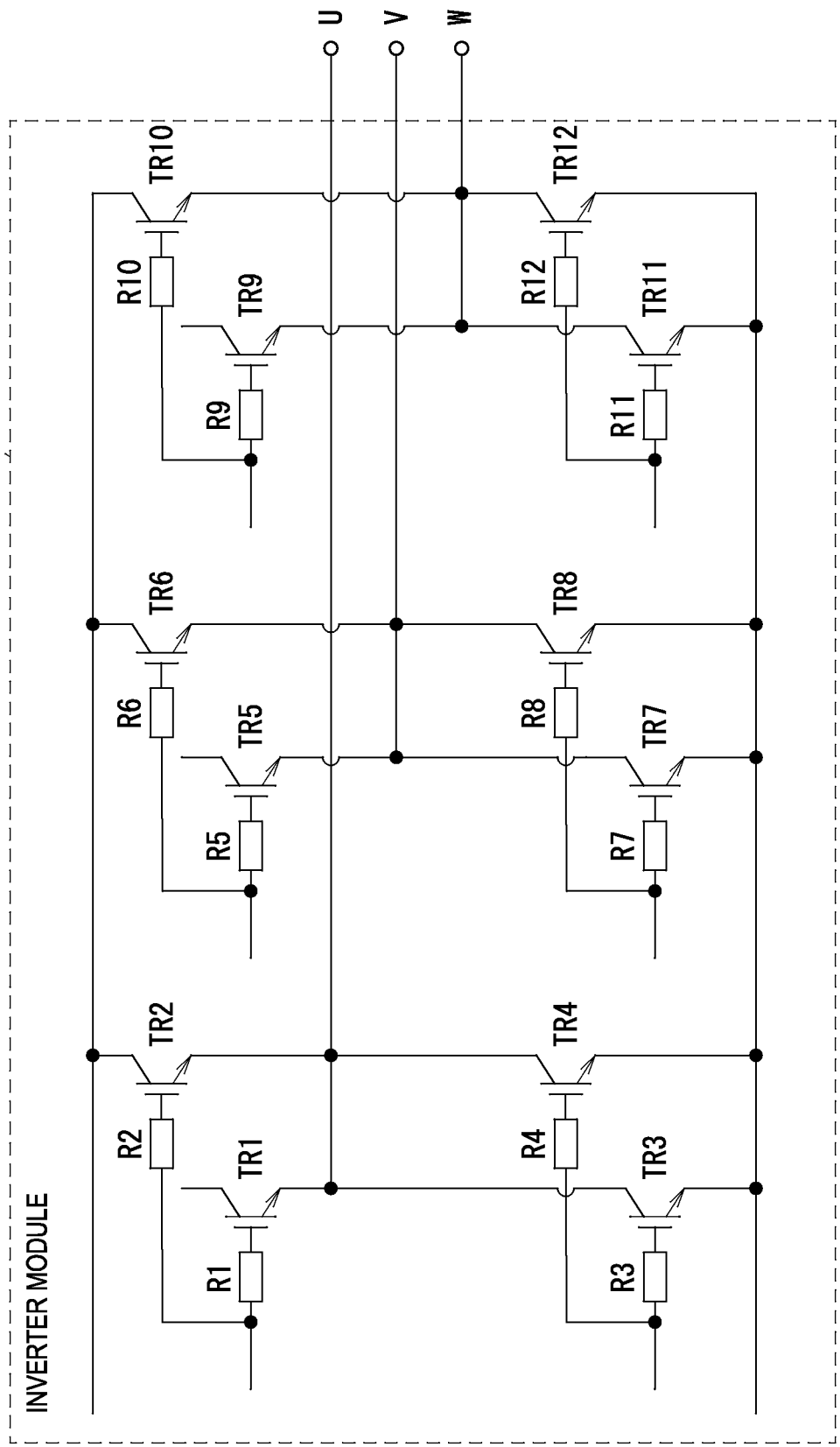
FIG. 9 is a circuit diagram illustrating the practical application of the resistive element according to the embodiment of the present invention.

The resistive element according to the embodiment of the present invention can be used for an inverter module 100 for driving a three-phase motor having a u-phase, a v-phase, and a w-phase, for example, as illustrated in FIG. 9. The inverter module 100 includes power semiconductor devices TR1, TR2, TR3, and TR4 for driving the u-phase, power semiconductor devices TR5, TR6, TR7, and TR8 for driving the v-phase, and power semiconductor devices TR9, TR10, TR11, and TR12 for driving the w-phase. The power semiconductor devices TR1 to TR12 are each connected to a freewheeling diode (not shown). The power semiconductor devices TR1 to TR12 may be IGBTs, and gate electrodes of the IGBTs are connected to gate resistors R1 to R12 in order to suppress an oscillation phenomenon upon switching operation.

The resistive element according to the embodiment of the present invention can be used as each of a pair of the gate resistors R1 and R2, a pair of the gate resistors R3 and R4, a pair of the gate resistors R5 and R6, a pair of the gate resistors R7 and R8, a pair of the gate resistors R9 and R10, and a pair of the gate resistors R11 and R12. For example, the resistive layers 3a and 3b illustrated in FIG. 1 correspond to the gate resistors R1 and R2. The side on which the gate resistors R1 and R2 are connected to the gate electrodes of the power semiconductor devices TR1 and TR2 corresponds to each terminal of the pair of the first electrodes 5a and 5b illustrated in FIG. 1. The side opposite to the side on which the gate resistors R1 and R2 are connected to the gate electrodes of the power semiconductor devices TR1 and TR2 corresponds to the terminal of the second electrode 9 illustrated in FIG. 1.

According to the resistive element pertaining to the embodiment of the present invention, the resistive-layer connection terminals at two ends of the relay wire 5c are connected to the resistive layers 3a and 3b, and the substrate connection terminal at another end of the relay wire 5c is connected to the semiconductor substrate 1 having a low specific resistivity with an ohmic contact at low contact resistance, so as to exhibit a vertical-type resistive element. Each of the resistive layers 3a and 3b is connected to a single pad region which is a part of each of the pair of the first electrodes 5a and 5b on the top surface side. The vertical-type resistive element thus requires only a single bonding wire for each of the resistive layers 3a and 3b, so as to decrease the total number of bonding wires, as compared with a lateral-type resistive element. Further, the areas of the pad regions on the top surface side of the first electrodes 5a and 5b can be decreased in the vertical-type resistive element, as compared with a lateral-type resistive element, and the size of the chip can be reduced accordingly.

A method of manufacturing the resistive element according to the embodiment of the present invention is illustrated below with reference to FIG. 10 to FIG. 19. It should be understood that the method of manufacturing the resistive element described below is a mere example, and the embodiment of the present invention can implement various methods other than the following method including modified examples within the scope of the invention as defined by the following appended claims.

Figure 10:
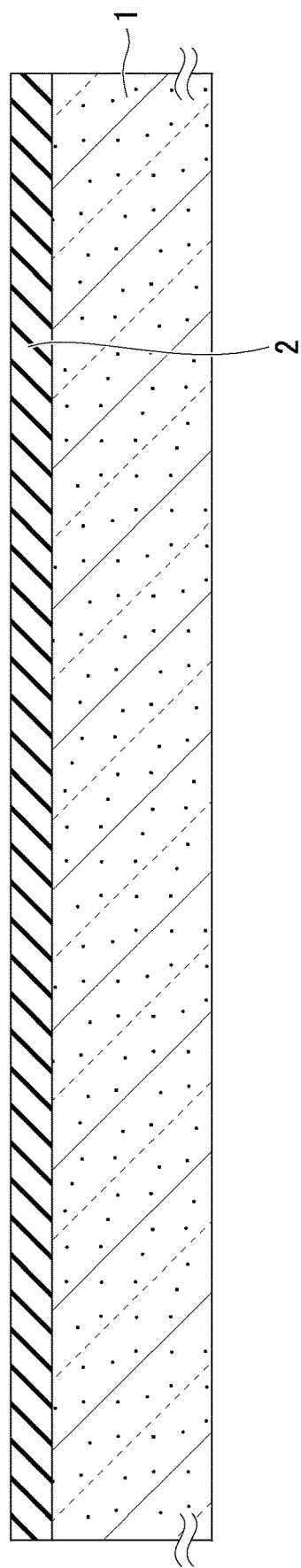
FIG. 10 is a cross-sectional view illustrating a process of manufacturing the resistive element according to the embodiment of the present invention.
Figure 11:
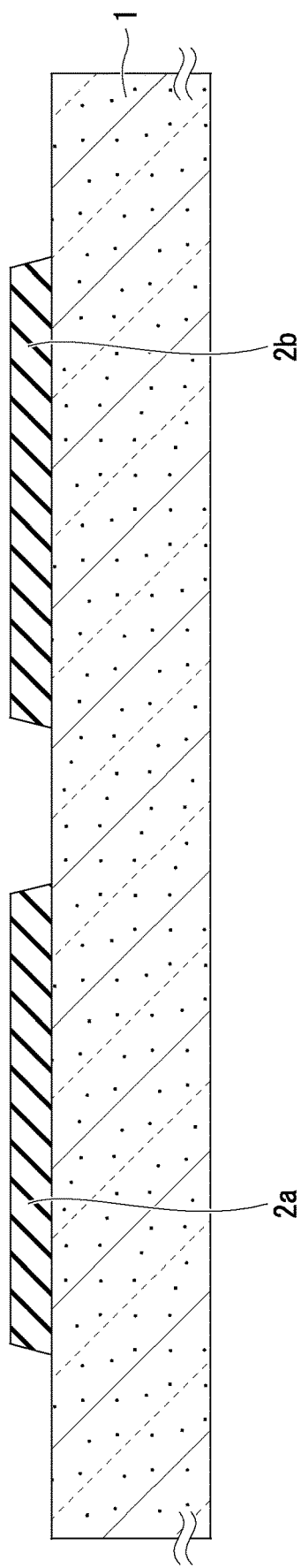
FIG. 11 is a cross-sectional view continued from FIG. 10 illustrating the process of manufacturing the resistive element according to the embodiment of the present invention.

First, the semiconductor substrate 1, such as a silicon substrate, doped with a high concentration of n-type impurity ions is prepared. As illustrated in FIG. 10, a first insulating film 2 such as a TEOS film is deposited on the semiconductor substrate 1 by a low-pressure (LP) CVD method, for example. The first insulating film 2 may be a composite film obtained such that a thermal oxide film is formed by a thermal oxidation method, and an insulating film is then stacked on the thermal oxide film by a CVD method. A photoresist film is then coated on the top surface of the first insulating film 2, and is delineated by photolithography. Using the delineated photoresist film as an etching mask, a part of the first insulating film 2 is selectively removed by dry etching such as reactive ion etching (RIE). The photoresist film is then removed, so as to form the first insulating films 2a and 2b partly on the top surface of the semiconductor substrate 1, as illustrated in FIG. 11.

Figure 12:
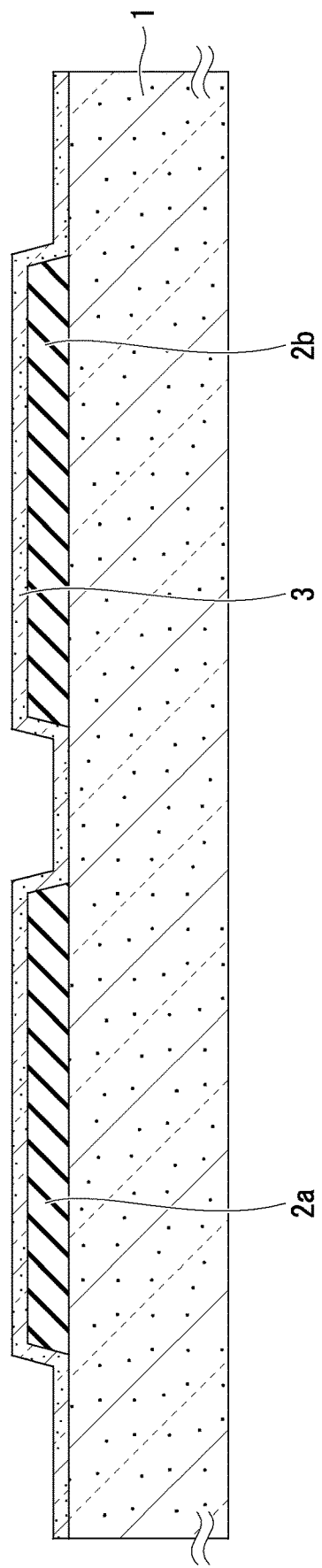
FIG. 12 is a cross-sectional view continued from FIG. 11 illustrating the process of manufacturing the resistive element according to the embodiment of the present invention.
Figure 13:
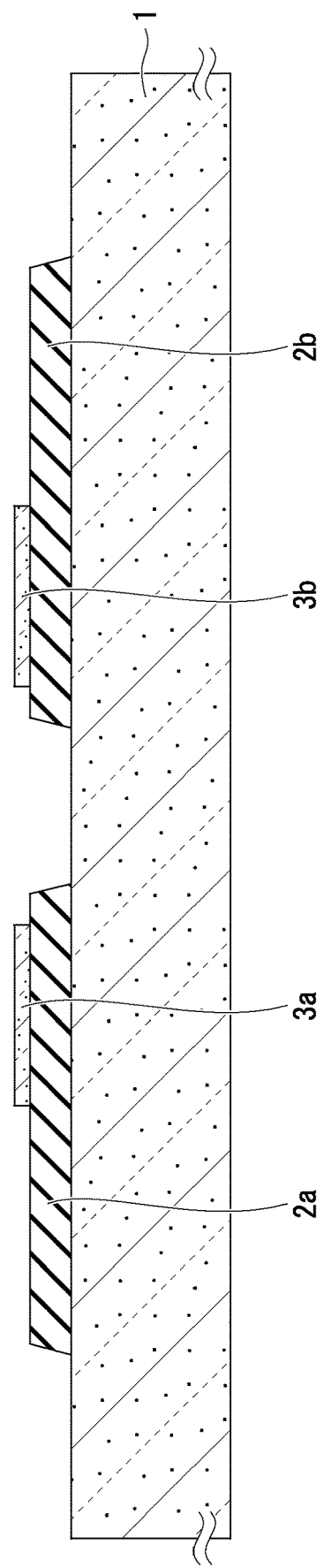
FIG. 13 is a cross-sectional view continued from FIG. 12 illustrating the process of manufacturing the resistive element according to the embodiment of the present invention.

Next, a non-doped polysilicon layer is formed on the semiconductor substrate 1 and the first insulating films 2a and 2b by a CVD method. N-type impurity ions such as phosphorus (P) are implanted in the polysilicon layer. For example, P impurity ions are implanted under the conditions of an acceleration voltage of 80 keV and a dose of about $6.0\times10^{15}$ cm$^{-2}$ or less. The impurity ions implanted by annealing are activated, so as to form a doped polysilicon layer 3 doped with the highly-concentrated n-type impurity ions, as illustrated in FIG. 12. A photoresist film is then coated on the top surface of the doped polysilicon film 3, and is delineated by photolithography. Using the delineated photoresist film as an etching mask, a part of the doped polysilicon layer 3 is selectively removed by RIE. The photoresist film is then removed, so as to form the resistive layers 3a and 3b on the first insulating films 2a and 2b, respectively, as illustrated in FIG. 13.

Figure 14:
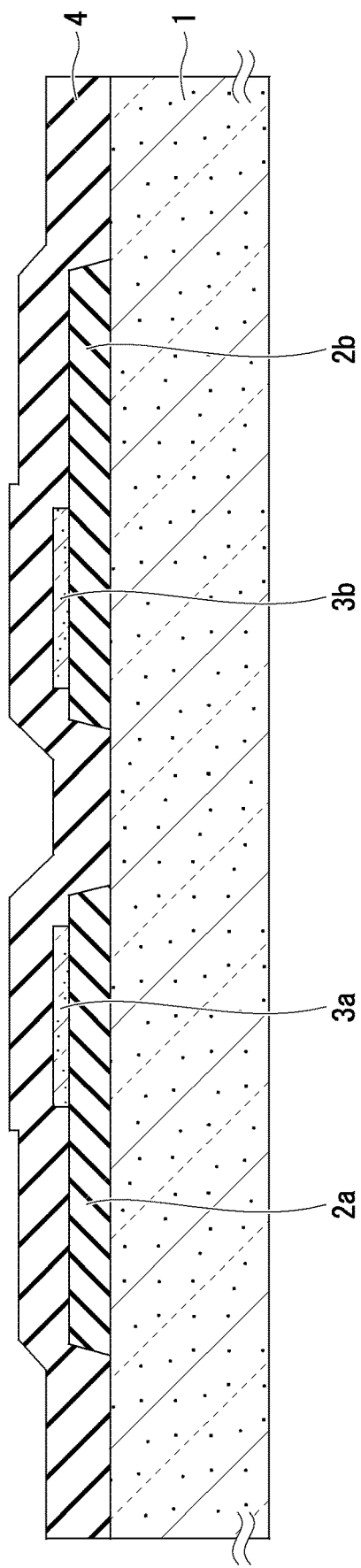
FIG. 14 is a cross-sectional view continued from FIG. 13 illustrating the process of manufacturing the resistive element according to the embodiment of the present invention.
Figure 15:
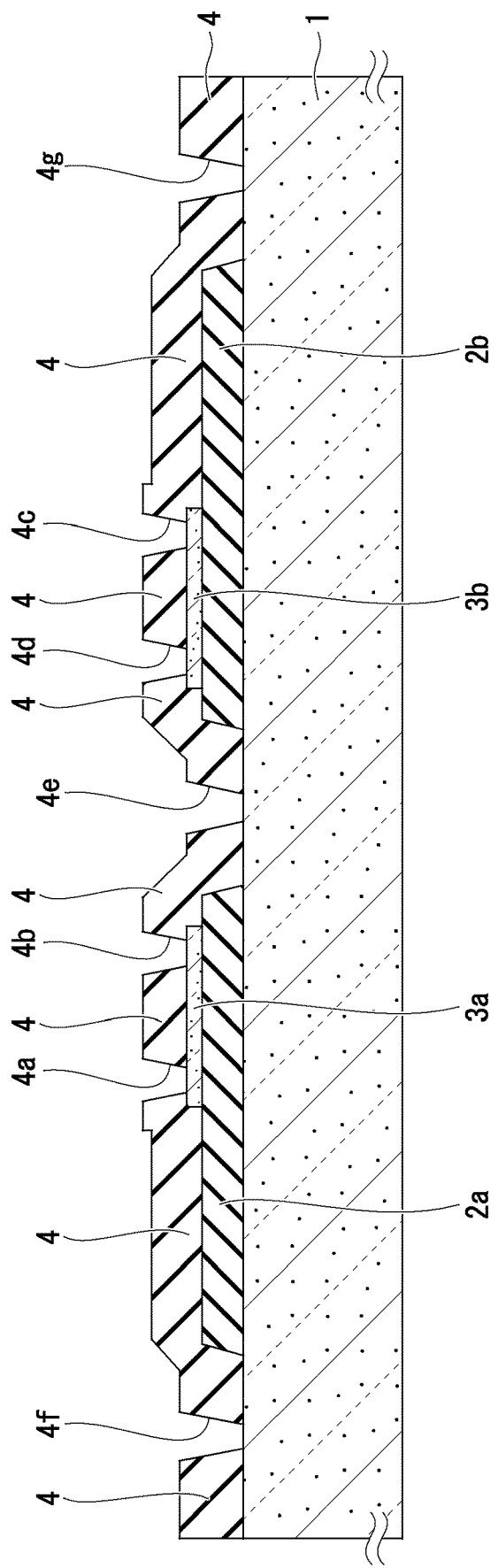
FIG. 15 is a cross-sectional view continued from FIG. 14 illustrating the process of manufacturing the resistive element according to the embodiment of the present invention.

Next, as illustrated in FIG. 14, the second insulating film 4 is deposited to cover the first insulating films 2a and 2b and the resistive layers 3a and 3b. The second insulating film 4 may be made of a composite film including a NSG film and a PSG film sequentially stacked by a CVD method, for example. A photoresist film is then coated on the second insulating film 4, and is delineated by photolithography. Using the delineated photoresist film as an etching mask, a part of the second insulating film 4 is selectively removed by RIE. The photoresist film is then removed, so as to open a first contact hole 4a and a second contact hole 4b on one side, a first contact hole 4c and a second contact hole 4d on the other side, and a third contact hole 4e in the second insulating film 4, as illustrated in FIG. 15. The second insulating film 4 is also provided with a fourth contact hole 4f on one side and a fourth contact hole 4g on the other side simultaneously.

Figure 16:
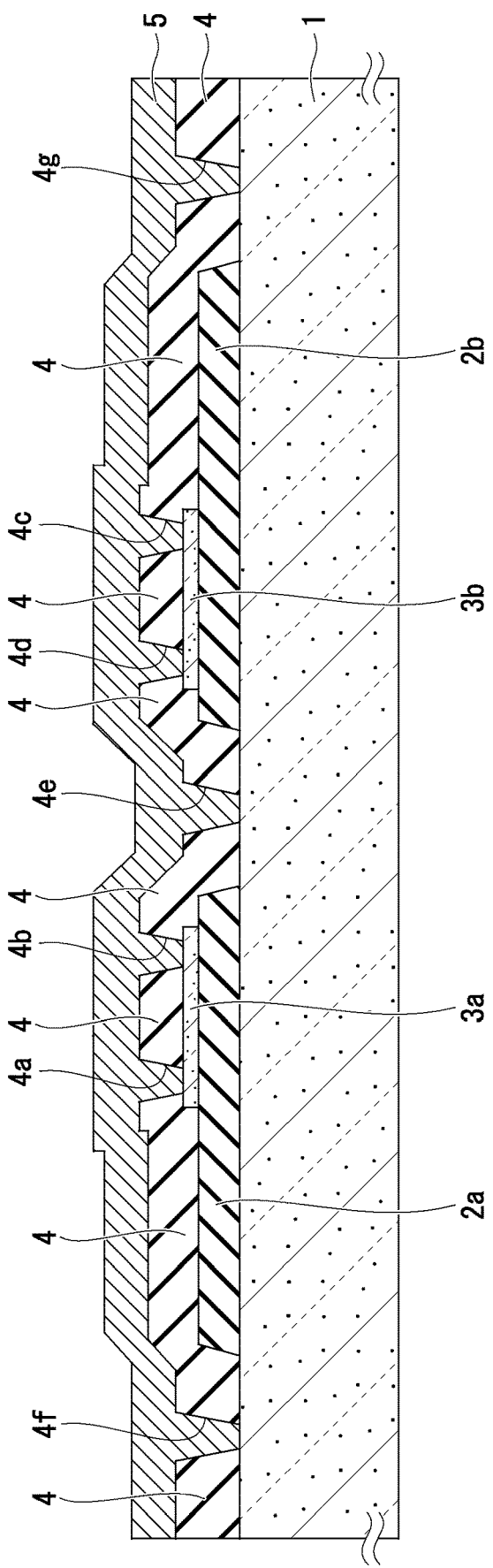
FIG. 16 is a cross-sectional view continued from FIG. 15 illustrating the process of manufacturing the resistive element according to the embodiment of the present invention.
Figure 17:
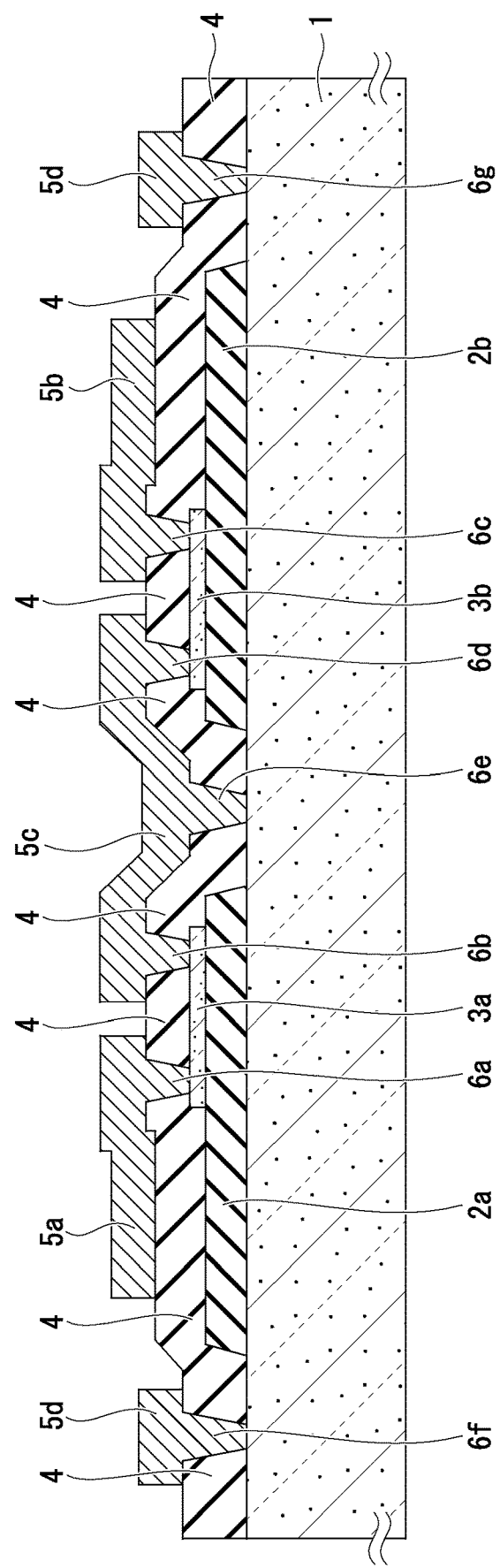
FIG. 17 is a cross-sectional view continued from FIG. 16 illustrating the process of manufacturing the resistive element according to the embodiment of the present invention.

Next, as illustrated in FIG. 16, a metallic film 5 is deposited on the second insulating film 4 to fill the contact holes 4a to 4g by vacuum evaporation or sputtering. The metallic film 5 may be made of a Ti—TiN film, an Al—Si film, and a TiN—Ti film sequentially stacked by a CVD method, for example. A photoresist film is then coated on the metallic film 5, and is delineated by photolithography. Using the delineated photoresist film as an etching mask, a part of the metallic film 5 is selectively removed, so as to form the pair of the first electrodes 5a and 5b, the relay wire 5c, and the guard ring layer 5d on the second insulating film 4, as illustrated in FIG. 17.

At the same time, the respective contact regions 6a to 6g are formed. The contact region 6a connects the first electrode 5a of the paired first electrodes 5a and 5b to the resistive layer 3a via the first contact hole 4a on one side, and the contact region 6b connects the first electrode 5a to the relay wire 5c via the second contact hole 4b on one side. The contact region 6e connects the relay wire 5c to the semiconductor substrate 1 via the third contact hole 4e. The contact region 6c connects the other first electrode 5b to the resistive layer 3b via the first contact hole 4c on the other side, and the contact region 6d connects the other first electrode 5b to the relay wire 5c via the second contact hole 4d on the other side. The contact regions 6f and 6g connect the guard ring layer 5d to the semiconductor substrate 1 via the fourth contact hole 4f on one side and the fourth contact hole 4g on the other side.

Figure 18:
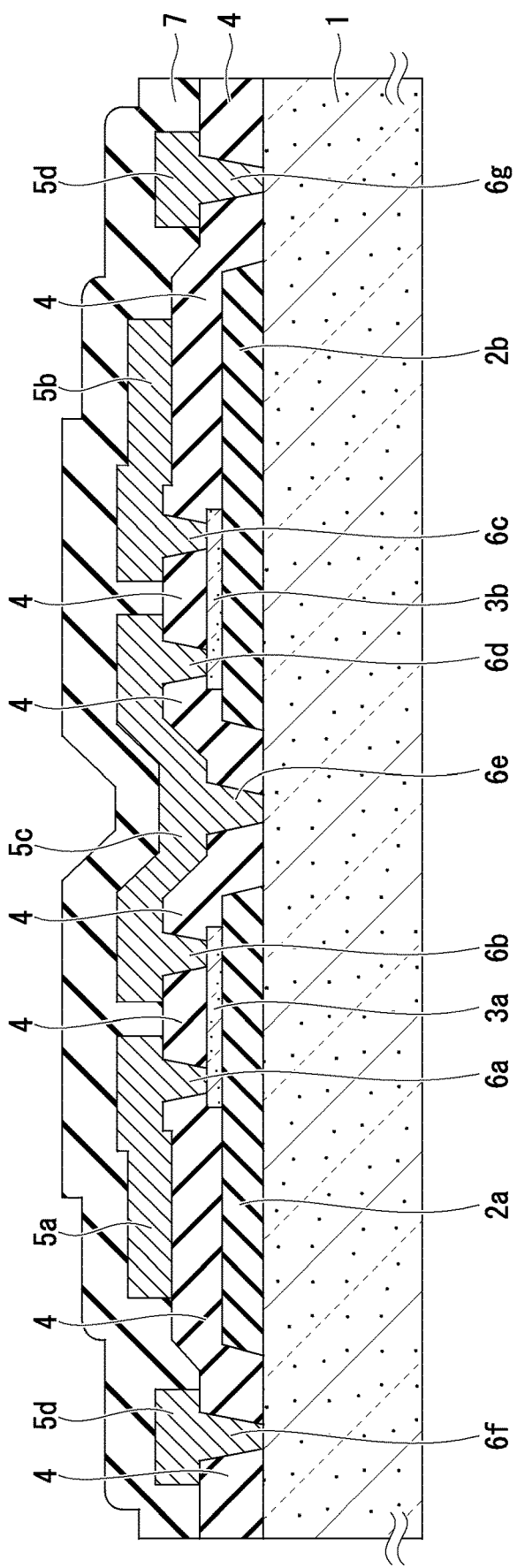
FIG. 18 is a cross-sectional view continued from FIG. 17 illustrating the process of manufacturing the resistive element according to the embodiment of the present invention.
Figure 19:
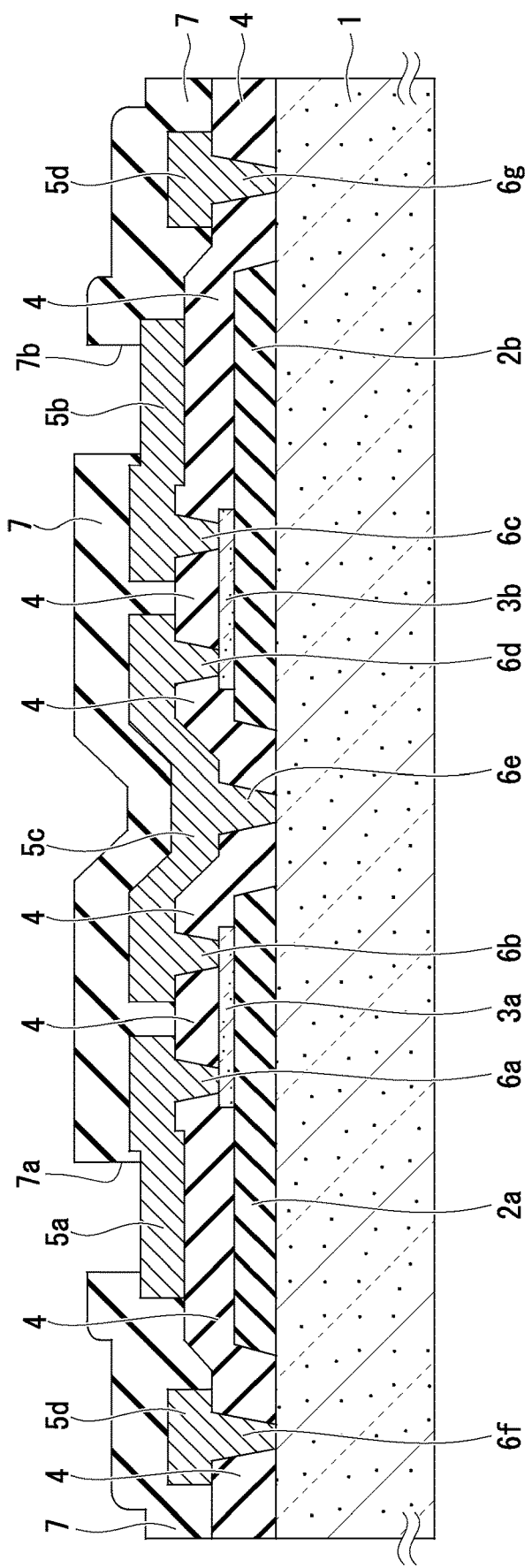
FIG. 19 is a cross-sectional view continued from FIG. 18 illustrating the process of manufacturing the resistive element according to the embodiment of the present invention.

Next, as illustrated in FIG. 18, the passivation film 7 is formed on the pair of the first electrodes 5a and 5b, the relay wire 5c, and the guard ring layer 5d. The passivation film 7 is formed such that a TEOS film and a $Si_3N_4$ film are sequentially stacked, and a polyimide film is further coated on the stacked film by a plasma CVD method, for example. A photoresist film is then coated on the passivation film 7, and is delineated by photolithography. Using the delineated photoresist film as an etching mask, a part of the passivation film 7 is selectively removed, so as to open the openings 7a and 7b in the passivation film 7 as illustrated in FIG. 19. The first electrodes 5a and 5b are exposed to the openings 7a and 7b to serve as pad regions.

Next, the bottom surface of the semiconductor substrate 1 is polished by chemical mechanical polishing (CMP) so as to decrease the thickness of the semiconductor substrate 1 to about 350 micrometers. The second electrode 9 is then formed on the bottom surface of the semiconductor substrate 1 by vacuum evaporation or sputtering. A plurality of elements, each substantially corresponding to the resistive element illustrated in FIG. 1, are formed in chip regions arranged into a matrix form in a single wafer. The chip regions are diced and divided into chips each corresponding to the resistive element illustrated in FIG. 1.

The method of manufacturing the resistive element according to the embodiment of the present invention facilitates the fabrication of the resistive element with the chip size reduced and the number of bonding wires decreased.

First Modified Example

Figure 20:
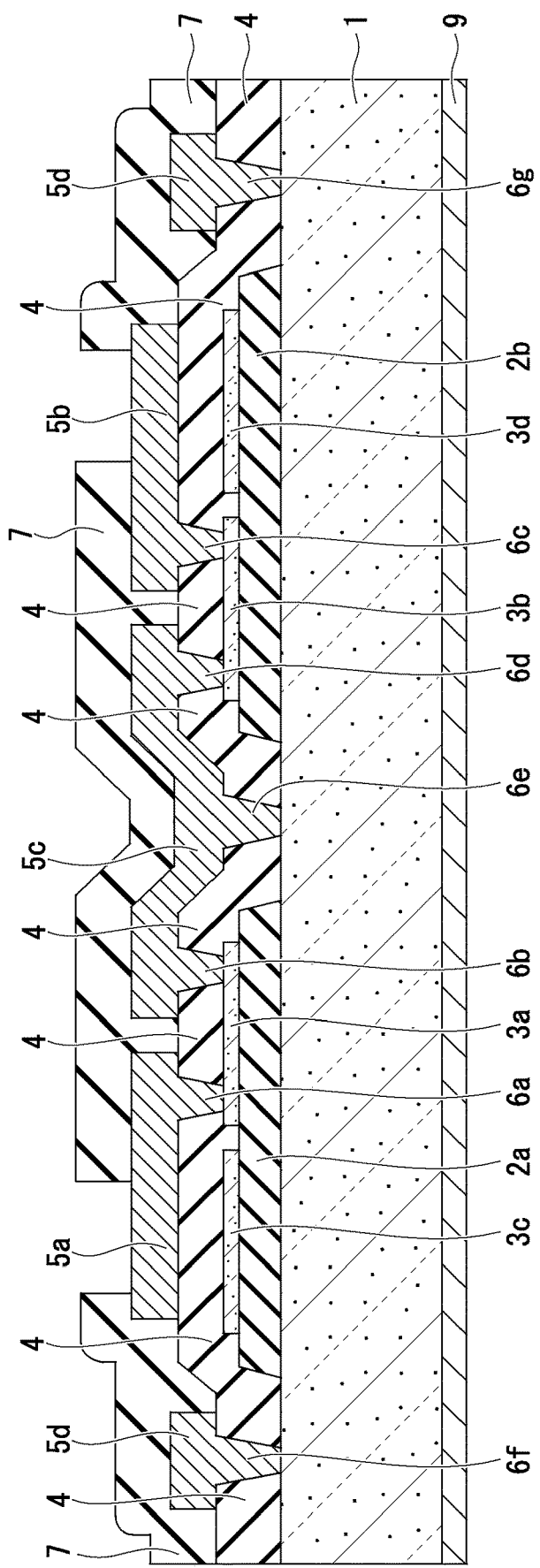
FIG. 20 is a cross-sectional view illustrating a resistive element according to a first modified example of the embodiment of the present invention.

A resistive element according to a first modified example of the embodiment of the present invention illustrated in FIG. 20 differs from the resistive element illustrated in FIG. 1 in further including auxiliary films 3c and 3d in a floating state in terms of potential allocated on the first insulating films 2a and 2b and separated from the resistive layers 3a and 3b.

The auxiliary film 3c is deposited below the first electrode 5a of the paired first electrodes 5a and 5b and separated from the resistive layer 3a. The auxiliary film 3d is deposited below the other first electrode 5b and separated from the resistive layer 3b. The auxiliary films 3c and 3d are made of the same material as the resistive layers 3a and 3b, such as n-type doped polysilicon, and have the same thickness as the resistive layers 3a and 3b. The auxiliary films 3c and 3d have a rectangular planar pattern, for example. The other structures in the resistive element according to the first modified example of the embodiment of the present invention are the same as those in the resistive element illustrated in FIG. 1 described above, and overlapping explanations are not repeated below.

The resistive element according to the first modified example of the embodiment of the present invention includes the auxiliary films 3c and 3d in a floating state in terms of potential allocated on the first insulating films 2a and 2b, so as to reduce the parasitic capacitance below the pair of the first electrodes 5a and 5b, as in the case of increasing the thickness of the first insulating films 2a and 2b. The resistive element according to the first modified example thus can avoid a decrease in the total resistance with respect to a reduction in impedance during operation at a high frequency so as to prevent oscillation.

A method of manufacturing the resistive element according to the first modified example of the embodiment of the present invention may form the auxiliary films 3c and 3d simultaneously with the resistive layers 3a and 3b by selectively removing the doped polysilicon layer 3 in the step illustrated in FIG. 13. The other steps of the method of manufacturing the resistive element according to the first modified example are the same as those of the method according to the embodiment described above, and overlapping explanations are not repeated below.

Second Modified Example

Figure 21:
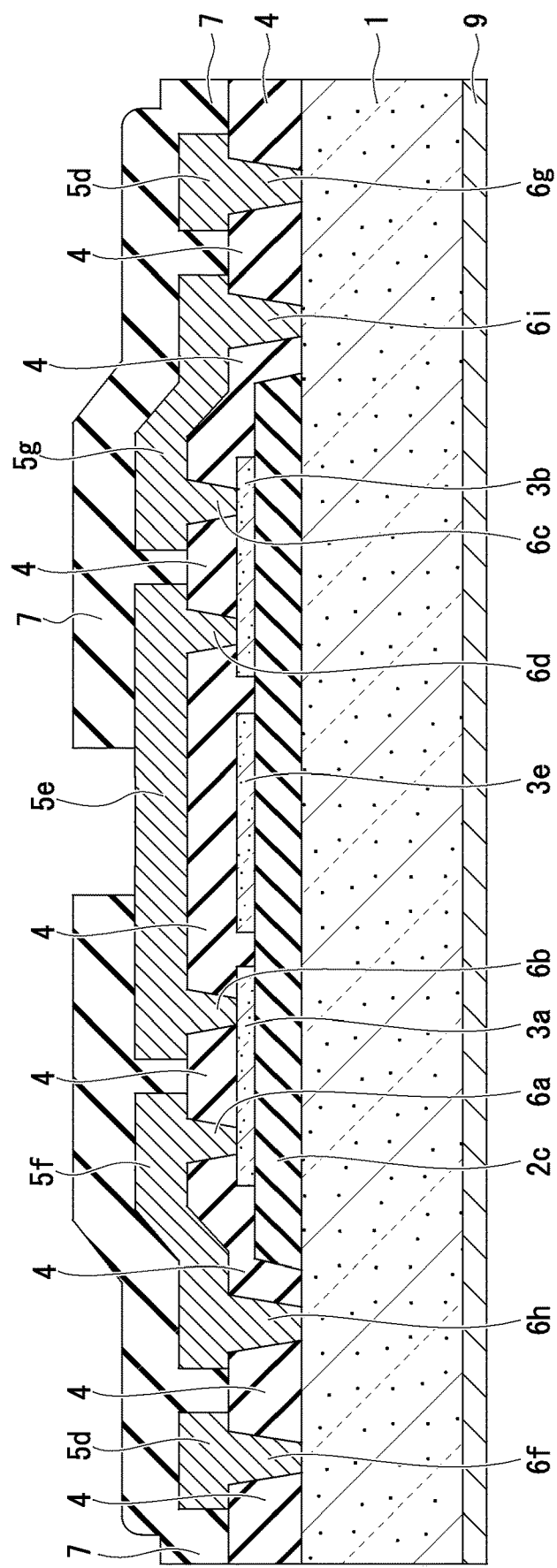
FIG. 21 is a cross-sectional view illustrating a resistive element according to a second modified example of the embodiment of the present invention.

The resistive element according to the embodiment of the present invention described above includes the plural first insulating films 2a and 2b, resistive layers 3a and 3b, and first electrodes 5a and 5b, and the single relay wire 5c electrically connected to each one end of the resistive layers 3a and 3b, as illustrated in FIG. 1. A resistive element according to a second modified example of the embodiment of the present invention illustrated in FIG. 21 differs from the resistive element illustrated FIG. 1 in including a plurality of resistive layers 3a and 3b and relay wires 5f and 5g, and a single first electrode 5e electrically connected to each one end of the resistive layers 3a and 3b.

An auxiliary film 3e in a floating state in terms of potential is deposited on a first insulating film 2c and separated from the resistive layers 3a and 3b so as to be interposed between the resistive layers 3a and 3b. The auxiliary layer 3e is made of the same material as the resistive layers 3a and 3b, such as n-type doped polysilicon, and has the same thickness as the resistive layers 3a and 3b. The auxiliary layer 3e has a rectangular planar pattern, for example. The single first electrode 5e is deposited on the second insulating film 4 and allocated in the middle of the chip. The paired relay wires 5f and 5g are deposited on the second insulating film 4 to interpose the first electrode 5e. One end of the first electrode 5e overlaps with one end of the resistive layer 3a in the depth direction, and the other end of the first electrode 5e overlaps with one end of the resistive layer 3b in the depth direction. One end of the relay wire 5f of the paired relay wires 5f and 5g overlaps with the other end of the resistive layer 3a in the depth direction. One end of the other relay wire 5g overlaps with the other end of the resistive layer 3b in the depth direction.

The first electrode 5e is connected to one end of the resistive layer 3a via a contact region 6b. The other end of the resistive layer 3a is connected to a resistive-layer connection terminal at one end of the relay wire 5f of the paired relay wires 5f and 5g via a contact region 6a. A substrate connection terminal at the other end of the relay wire 5f is connected to the semiconductor substrate 1 with an ohmic contact via a contact region 6h. The first electrode 5e is also connected to one end of the resistive layer 3b via a contact region 6d. The other end of the resistive layer 3b is connected to a resistive-layer connection terminal at one end of the other relay wire 5g via a contact region 6c. A substrate connection terminal at the other end of the other relay wire 5g is connected to the semiconductor substrate 1 with an ohmic contact via a contact region 6i.

The resistive layers 3a and 3b are thus connected to the semiconductor substrate 1 in series via the pair of the relay wires 5f and 5g, so as to exhibit a vertical-type resistive element to provide a resistor between the first electrode 5e and the second electrode 9. The other structures in the resistive element according to the second modified example of the embodiment of the present invention are the same as those in the resistive element illustrated in FIG. 1 described above, and overlapping explanations are not repeated below.

The resistive element according to the second modified example of the embodiment of the present invention includes the pair of the relay wires 5f and 5g connecting the resistive layers 3a and 3b to the semiconductor substrate 1 in series to provide a resistor between the first electrode 5e and the second electrode 9. The resistive layers 3a and 3b are connected to a single pad region which is a part of the first electrode 5e on the top surface side. The resistive element according to the second modified example thus requires only a single bonding wire, so as to decrease the total number of bonding wires, as compared with a lateral-type resistive element. Further, the area of the pad region on the top surface side of the first electrode 5e can be decreased as compared with a lateral-type resistive element, and the size of the chip can be reduced accordingly.

The arrangement of the auxiliary film 3e in a floating state in terms of potential deposited on the first insulating film 2c can reduce the parasitic capacitance, as in the case of increasing the thickness of the first insulating film 2c. The resistive element according to the second modified example thus can avoid a decrease in the total resistance with respect to a reduction in impedance during operation at a high frequency so as to prevent oscillation.

A method of manufacturing the resistive element according to the second modified example of the embodiment of the present invention may form the auxiliary film 3e simultaneously with the resistive layers 3a and 3b by selectively removing the doped polysilicon layer 3 in the step illustrated in FIG. 13. The resistive element according to the second modified example differs from the resistive element according to the embodiment illustrated in FIG. 1 in the arrangement positions and the number of the first insulating film 2c, the resistive layers 3a and 3b, the first electrode 5e, and the pair of the relay wires 5f and 5g, for example. However, the other steps of the method of manufacturing the resistive element according to the second modified example are the same as those of the method according to the embodiment described above, and overlapping explanations are not repeated below.

Other Embodiments

While the present invention has been described above by reference to the embodiment, it should be understood that the present invention is not intended to be limited to the descriptions of the Specification and the drawings composing part of this disclosure. Various alternative embodiments, examples, and technical applications will be apparent to those skilled in the art according to this disclosure.

While the embodiment of the present invention has illustrated the resistive element including the two resistive layers 3a and 3b in one chip as illustrated in FIG. 1, each chip may be provided with a single resistive layer. The resistive element illustrated in FIG. 1 may eliminate the structure on the right side including the first insulating film 2b, the resistive layer 3b, and the first electrode 5b. The resistive element illustrated in FIG. 20 may eliminate the structure on the right side including the first insulating film 2b, the resistive layer 3b, the first electrode 5b, and the auxiliary film 3d. The resistive element illustrated in FIG. 21 may eliminate the structure on the right side including the resistive layer 3b and the relay wire 5g. Alternatively, three or more resistive layers may be provided in a single chip.

The embodiment of the present invention has exemplified the case in which the resistive element is used as the gate resistors R1 to R12, as illustrated in FIG. 9. However, the resistive element is not limited to be used as the gate resistors R1 to R12, and may be used as a resistive element for various types of integrated circuit (IC).

What is claimed is:
1. A resistive element comprising:
a semiconductor substrate;
a first insulating film deposited on the semiconductor substrate;
a resistive layer deposited on the first insulating film;
a second insulating film deposited to cover the first insulating film and the resistive layer;
a first electrode deposited on the second insulating film and electrically connected to the resistive layer;
a relay wire deposited on the second insulating film without being in contact with the first electrode, and including a resistive-layer connection terminal electrically connected to the resistive layer and a substrate connection terminal connected to the semiconductor substrate with an ohmic contact; and a second electrode deposited on a bottom side of the semiconductor substrate, wherein a resistor is provided between the first electrode and the second electrode.

2. The resistive element of claim 1, wherein a resistive component of the semiconductor substrate is one hundredth or less of a resistive component of the resistive layer.

3. The resistive element of claim 1, further comprising an auxiliary film in a floating state in terms of potential deposited on the first insulating film and below the first electrode, separated from the resistive layer, and made of a material identical to a material of the resistive layer.

4. The resistive element of claim 1, wherein:
the resistive element comprises a plurality of the first insulating films, a plurality of the resistive layers, and a plurality of the first electrodes; and
the relay wire is interposed between the plurality of the first electrodes and includes a plurality of the resistive-layer connection terminals corresponding to the plurality of the resistive layers.

5. The resistive element of claim 4, wherein:
the relay wire has a rectangular shape in a planar pattern allocated on a straight line passing through a center of a chip; and
the plurality of the resistive layers and the plurality of the first electrodes each have a rectangular shape in a planar pattern with line symmetry about the straight line.

6. The resistive element of claim 1, wherein:
the resistive element comprises a plurality of the resistive layers and a plurality of the relay wires; and
the first electrode is interposed between the plurality of the relay wires and electrically connected to the plurality of the resistive layers.

7. The resistive element of claim 1, wherein:
the resistive layer and the first electrode are connected to each other via a first contact hole cut in the second insulating film; and
the resistive layer and the second electrode are connected to each other via a second contact hole cut in the second insulating film at a position separated from the first contact hole.

8. The resistive element of claim 7, wherein a planar pattern of the resistive layer is a rectangular shape defined by a resistance length direction and a resistance width direction orthogonal to the resistance length direction.

9. The resistive element of claim 8, wherein the planar pattern of the resistive layer is longer in the resistance width direction than in the resistance length direction.

10. The resistive element of claim 8, wherein:
the first contact hole includes:
a first outer contact allocated in the resistive layer defined in the resistance length direction; and
a first inner contact allocated closer to a middle of the resistive layer than the first outer contact in the resistance length direction,
the second contact hole includes:
a second outer contact allocated in the resistive layer defined in the resistance length direction; and
a second inner contact allocated closer to the middle of the resistive layer than the second outer contact in the resistance length direction, and
as viewed in the resistance length direction,
the first inner contact is shifted from the second inner contact,
the first inner contact is at least partly opposed to the second outer contact, and
the second inner contact is at least partly opposed to the first outer contact.

11. The resistive element of claim 10, wherein a distance between the first inner contact and the second outer contact opposed to each other is identical to a distance between the second inner contact and the first outer contact opposed to each other.

12. The resistive element of claim 10, wherein:
the resistive element comprises a set of the first inner contacts, a set of the second inner contacts, a set of the first outer contacts, and a set of the second outer contacts, the contacts in each set being aligned in the resistance width direction; and
as viewed in the resistance length direction,
positions of the first inner contacts in the resistance width direction are shifted from positions of the second inner contacts in the resistance width direction,
the positions of the first inner contacts in the resistance width direction are opposed to positions of the second outer contacts in the resistance width direction, and
the positions of the second inner contacts in the resistance width direction are opposed to positions of the first outer contacts in the resistance width direction.

13. The resistive element of claim 10, wherein:
the resistive element comprises a set of the first inner contacts and a set of the second inner contacts, the contacts in each set being aligned in the resistance width direction; and
as viewed in the resistance length direction,
positions of the first inner contacts in the resistance width direction are shifted from positions of the second inner contacts in the resistance width direction,
the positions of the first inner contacts in the resistance width direction are partly opposed to a position of the second outer contact extending in a line pattern in the resistance width direction, and
the positions of the second inner contacts in the resistance width direction are partly opposed to a position of the first outer contact extending in a line pattern in the resistance width direction.

14. The resistive element of claim 1, wherein the relay wire is deposited on the resistive layer.

15. The resistive element of claim 1, wherein
the resistive element comprises a plurality of the first electrodes, and
the relay wire is interposed between the plurality of the first electrodes without being in contact with the plurality of the first electrodes.

16. A method of manufacturing a resistive element, comprising:
forming a first insulating film on a semiconductor substrate;
forming a resistive layer on the first insulating film;
forming a second insulating film to cover the first insulating film and the resistive layer;
cutting, in the second insulating film, a first contact hole to which the resistive layer is exposed, a second contact hole to which the resistive layer is exposed at a position separated from the first contact hole, and a third contact hole to which a part of a top surface of the semiconductor substrate is exposed at a position separated from the first contact hole and the second contact hole;

forming a first electrode electrically connected to the resistive layer via the first contact hole and depositing the first electrode on the second insulating film;

forming a relay wire electrically connected to the resistive layer via the second contact hole, the relay wire including a resistive-layer connection terminal electrically connected to the resistive layer and a substrate connection terminal connected to the semiconductor substrate with an ohmic contact via the third contact hole; and forming a second electrode on a bottom side of the semiconductor substrate, wherein a resistor is provided between the first electrode and the second electrode.

17. The method of manufacturing the resistive element of claim 16, further comprising, simultaneously with forming the resistive layer, forming an auxiliary film in a floating state in terms of potential on the first insulating film and below the first electrode, the auxiliary film being separated from the resistive layer and made of a material identical to a material of the resistive layer.

* * * * *